US 6,304,093 B1

(12) United States Patent
Hilmoe et al.

(10) Patent No.: US 6,304,093 B1
(45) Date of Patent: Oct. 16, 2001

(54) TRANSPORTATION AND ACTIVE TEMPERATURE CONTROL OF INTEGRATED CIRCUITS FOR TEST (75) Inventors: Mark K. Hilmoe, Powell; Thomas P. Jones; Brian G. Annis, both of Westerville; Mark F. Malinoski, Dublin, all of OH (US)

(73) Assignee: Schlumberger Technologies Inc., San Jose, CA (US)

( * ) Notice: Subject to any disclaimer, the term of this patent is extended or adjusted under 35 U.S.C. 154(b) by 0 days.

(21) Appl. No.: 09/453,464

(22) Filed: Dec. 2, 1999

Related U.S. Application Data (60) Provisional application No. 60/110,829, filed on Dec. 2, 1998.

(51) Int. Cl.[7] ................................................ G01R 31/02
(52) U.S. Cl. ....................................................... 324/760
(58) Field of Search .................................. 324/760, 755, 324/765; 269/25, 27, 35, 56, 58

(56) References Cited

U.S. PATENT DOCUMENTS

| | | | |
|---|---|---|---|
| 4,506,213 | 3/1985 | O'Connor | 324/73 |
| 4,604,572 | 8/1986 | Horiuchi et al. | 324/158 |
| 4,777,434 | 10/1988 | Miller et al. | 324/158 F |
| 4,926,118 | 5/1990 | O'Connor et al. | 324/158 F |
| 5,006,796 | 4/1991 | Burton et al. | 324/158 F |
| 5,093,984 | 3/1992 | Lape | 29/741 |
| 5,126,656 | 6/1992 | Jones | 324/158 F |
| 5,143,450 | 9/1992 | Smith et al. | 374/12 |
| 5,164,661 | 11/1992 | Jones | 324/158 F |
| 5,172,049 | 12/1992 | Kiyokawa et al. | 324/158 F |
| 5,177,435 | 1/1993 | Kiyokawa et al. | 324/158 F |
| 5,180,975 | 1/1993 | Andoh et al. | 324/158 F |
| 5,201,875 | 4/1993 | Tessier et al. | 294/64.1 |
| 5,208,529 | 5/1993 | Tsurishima et al. | 324/158 F |
| 5,227,717 | 7/1993 | Tsurishima et al. | 324/158 F |
| 5,261,775 | 11/1993 | Kobayashi | 414/403 |
| 5,263,775 | 11/1993 | Smith et al. | 374/134 |
| 5,290,134 | 3/1994 | Baba | 414/404 |
| 5,307,001 | 4/1994 | Tani | 324/158 F |
| 5,310,039 | 5/1994 | Butera et al. | 198/346.2 |
| 5,313,156 | 5/1994 | Klug et al. | 324/158 F |
| 5,315,240 | 5/1994 | Jones | 324/158 F |
| 5,330,043 | 7/1994 | Stuckey | 198/346.2 |
| 5,374,158 | 12/1994 | Tessier et al. | 414/759 |
| 5,420,521 | 5/1995 | Jones | 324/760 |
| 5,469,953 | 11/1995 | Igarashi et al. | 198/345.2 |
| 5,563,521 | 10/1996 | Crumly | 324/757 |
| 5,574,383 | 11/1996 | Saito et al. | 324/755 |
| 5,588,797 | 12/1996 | Smith | 414/797.5 |
| 5,614,837 | 3/1997 | Itoyama et al. | 324/760 |
| 5,648,728 | * 7/1997 | Canella | 324/755 |
| 5,690,467 | 11/1997 | Smith | 414/795.2 |
| 5,807,066 | 9/1998 | Smith | 414/802 |
| 5,847,293 | 12/1998 | Jones | 73/865.8 |
| 5,894,217 | 4/1999 | Igarashi et al. | 324/158.1 |
| 5,907,246 | * 5/1999 | Abraham et al. | 324/760 |

* cited by examiner

Primary Examiner—Safet Metjahic
Assistant Examiner—E P LeRoux
(74) Attorney, Agent, or Firm—Foley & Lardner (57) ABSTRACT A handler for a device under test ("DUT") includes a rotating table which supports up to eight DUTs. The DUTs are held in place over openings in the table and separate heat exchangers contact the individual DUTs through the openings and conductively control the temperature of the DUTs. Six of the DUTs are in conditioning stations and are lifted off of the rotary table until they contact separate spring-loaded pads. One of the DUTs is in a test station and it is lifted off of the rotary table until it contacts a test head, at which point testing is performed. The temperature of each of the DUTs is controlled throughout the process.

23 Claims, 12 Drawing Sheets

TRANSPORTATION AND ACTIVE TEMPERATURE CONTROL OF INTEGRATED CIRCUITS FOR TEST

CROSS-REFERENCE TO RELATED APPLICATION

This application claims the priority of previously filed provisional application No. 60/110,829, filed on Dec. 2, 1998, which is hereby fully incorporated by reference.

BACKGROUND OF THE INVENTION

1. Field of the Invention

This invention relates in general to the field of transporting and controlling the temperature of integrated circuits ("ICs") and more particularly to an improved apparatus, system, and method of transporting ICs and controlling the temperature of ICs for testing.

2. Description of the Related Art

Previous systems for transporting IC devices to a test site use a carrier-conveyor system. The IC device is taken from a tray on which the IC device is resting in a "live bug" position (connections down) by a "pick and place" handling system. Typically, the pick and place handling system uses a vacuum handling device to pick up the IC device from its tray and place the IC device on a carrier, still in a live bug position. The carrier slides or moves through the conveyor towards the test site.

For testing at non-ambient temperature conditions, the carrier passes through or is contained within a passive convection heating or cooling apparatus, such as a convection oven or "soak site." The number of carriers in the conveyor, combined with the time spent at the test site, defines how long the convection apparatus is used to bring the IC device to the temperature desired for testing. A characterization process is typically used to determine whether the IC device has reached the desired test temperature by the time it reaches the test site. The characterization process usually requires the use of special thermal test devices with an external temperature measuring apparatus. The external temperature measuring apparatus may include thermocouple sensors which can read a thermocouple voltage and translate it into a temperature reading. Once the carrier reaches the test site, the IC device is typically removed from the carrier by a second vacuum handling device and is placed into a test site socket, with the necessary socketing force. In some systems, the IC device is not removed from the carrier. Instead, the carrier is placed under a contactor and the IC device is pressed against the test site socket, using a pressing mechanism. This approach is popular with memory IC handling systems or systems which achieve a high degree of parallel testing.

After testing, the IC device is placed back into the carrier by the vacuum handling device and the carrier continues to move through the conveyor system. In some systems, the conveyor system continues through a second convection apparatus, called a "de-soak chamber." The de-soak chamber is used to force the temperature of the IC device back to a safe handling temperature or above the dew point temperature.

That is, back to a safe handling temperature when the testing is hot, and above the dew point temperature when the testing is cold.

After exiting the de-soak chamber, if any, the vacuum handling device removes the IC device from the carrier and places it into a tray, typically a JEDEC (Joint Electronic Device Engineering Council) compliant tray. The particular tray used depends on whether the IC device successfully passed the testing process. Depending on the test results, the trays are dispatched to their next process location.

A disadvantage of such a system is that there is no provision to maintain the device under test ("DUT") temperature while the test is underway. Heat can be lost in some cases through the test site socket. The test can also cause the IC device to heat itself. For some critical, speed dependent tests, the resulting variation in the test temperature setpoint can frequently impair the quality of the test result.

Another disadvantage is that the complexity of and the number of moving parts of the soak and de-soak chambers can impair reliability of the handling system. Exposing moving parts, which may have different thermal expansion coefficients, to test temperatures complicates the design of the parts and subjects the operation to considerable wear. Passive convection heating and cooling apparatuses require that the moving parts of the apparatus be exposed to the sometimes extreme temperatures experienced by the IC device. These temperatures may affect the conveyor mechanism and further impair reliable operation. To remove an obstacle, clear a jam or service the system requires that the soak chamber be brought to safe handling temperatures. This consumes valuable production equipment utilization time. In the case of IC devices with a large thermal capacitance, the capacity requirements for the soak chamber are increased, which further aggravates the complexity and temperature exposure reliability concerns.

Therefore, a need has arisen for a system for transporting an IC device to a position for being tested which reduces the complexity of the transfer system. A further need exists for a system for transporting an IC device to a position for being tested which reduces the temperature exposure of the transport mechanism. A further need exists for a system which reduces the lost utilization time when the transport mechanism requires servicing. Another need exists for a system for efficiently bringing an IC device to a desired temperature for testing.

SUMMARY OF THE INVENTION

Briefly, in accordance with one aspect of the present invention, there is provided a system for handling a device under test ("DUT"). The system includes a carrier, a receptacle, a tooling system, and a lift mechanism. The carrier is for supporting the DUT, and the carrier has an aperture which is adapted to be disposed below at least a portion of the DUT. The receptacle is for supporting the carrier. The receptacle also has an aperture, and the receptacle is adapted to maintain the alignment of the carrier such that the carrier aperture overlaps at least part of the receptacle aperture. The tooling system is for conductively controlling a temperature of the DUT and for supporting the DUT. The lift mechanism is coupled to the tooling system.

The lift mechanism is for raising and lowering the tooling system when both the receptacle aperture and the carrier aperture are vertically aligned with the tooling system such that at least a portion of the tooling system can penetrate both the receptacle aperture and the carrier aperture and contact the DUT. The lift mechanism is further coupled to the receptacle to facilitate the vertical alignment. When the tooling system is raised to contact the DUT, the lift mechanism further raises the tooling system to raise the DUT above the carrier such that the DUT is not in direct contact with the carrier.

Briefly, in accordance with another aspect of the present invention, there is provided a method of handling a device under test ("DUT"). The method includes (i) supporting the DUT with a structure adapted to support the weight of the DUT, (ii) contacting the DUT with a conductive temperature control system, (iii) vertically raising the supported DUT off of the structure so that the DUT is not in direct contact with the structure, and (iv) maintaining contact between the DUT and the conductive temperature control system while the DUT is not in direct contact with the structure.

Briefly, in accordance with another aspect of the present invention, there is provided a system for handling a device under test ("DUT"). The system includes support means, a transport device, temperature controlling means, and lifting means. The support means is for supporting the DUT and it includes an aperture. The transport device is coupled to the support means and is for moving the DUT. The temperature controlling means is for controlling the temperature of the DUT with conduction. The lifting means is for lifting the DUT above the support means such that the DUT is not in direct contact with the support means.

Briefly, in accordance with another aspect of the present invention, there is provided a tooling system for handling a device under test ("DUT"). The tooling system includes a heat exchanger and a contact pad. The tooling system is adapted to apply a first force for contacting the heat exchanger to the DUT. The tooling system is adapted to apply a second force for contacting the contact pad to the DUT to secure the DUT in a fixed location for testing.

Briefly, in accordance with another aspect of the present invention, there is provided a method for positioning a semiconductor device under test ("DUT"). The method includes measuring a distance traveled by the DUT, providing feedback on the distance traveled, and utilizing the distance traveled to control the position of the DUT.

DESCRIPTION OF THE PREFERRED EMBODIMENT

The above-noted and other aspects of the present invention will become more apparent from a description of the preferred embodiment, when read in conjunction with the accompanying drawings. The drawings illustrate the preferred embodiment of the invention. In the drawings, the same members have the same reference numerals.

1. Rotary Transport Device

Figure 1A:
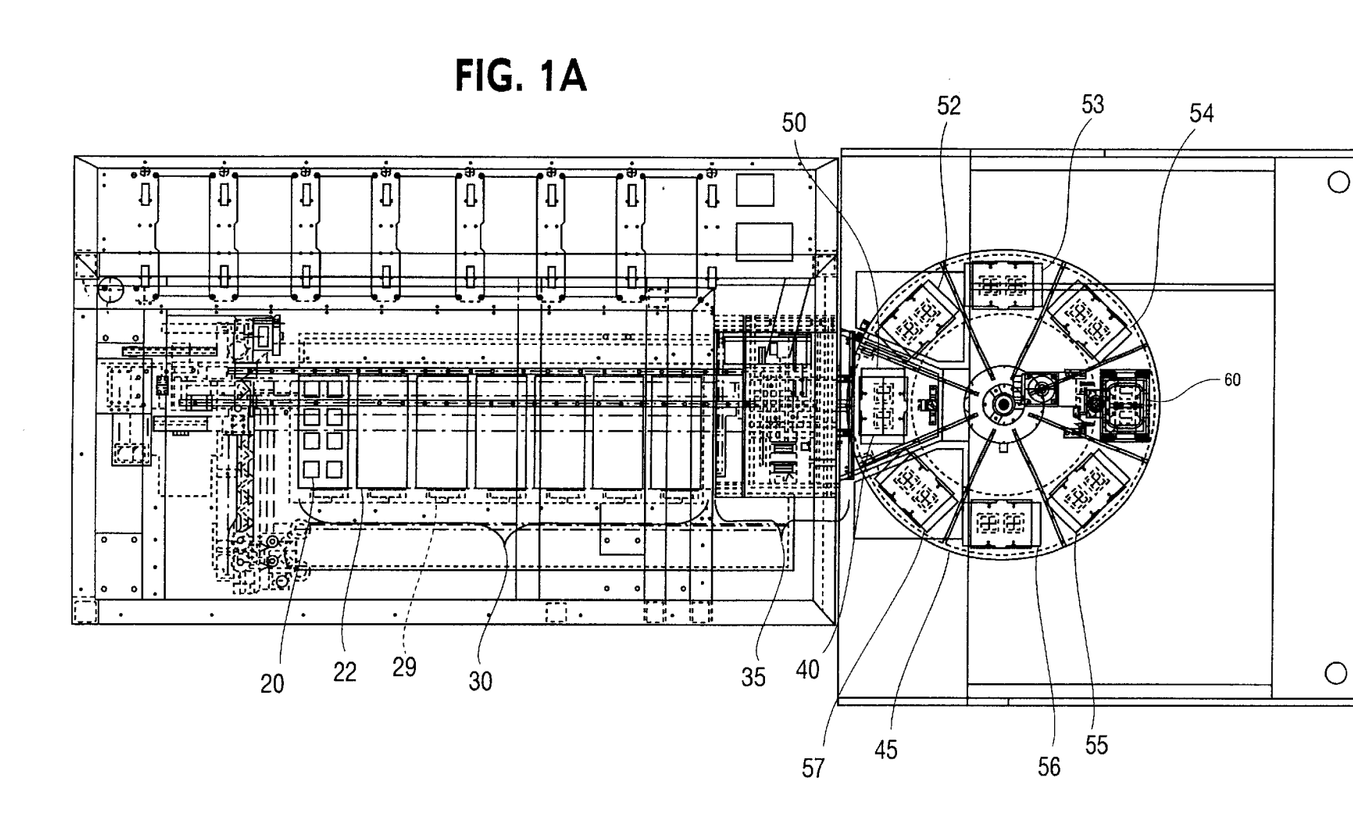
FIG. 1A is a top view of an embodiment of the present invention.
Figure 2A:
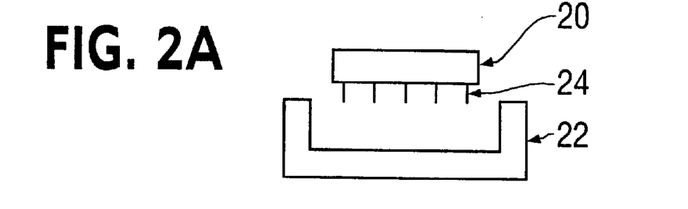
FIG. 2A depicts an IC device in a "live bug" position.

Referring to FIG. 1A, in a preferred embodiment of the present invention, an IC device 20 in a tray 22 is transported by a Cartesian robot (not illustrated) to an active tray nest 29 in a staging area 30. The IC device 20 is positioned in the tray 22 in a "live bug" position, that is, with its connections 24, pointing down towards the tray 22. The live bug position is illustrated in FIG. 2A. In the active tray nest 29, the IC device 20 is picked up by a vacuum handler (not illustrated), which places the IC device 20 in an inversion handler 35, still in a live bug position (connections 24 pointing down towards the inversion handler). As described in co-pending provisional application U.S. Ser. No. 60/110,827 (attorney docket number 42811-107), filed on Dec. 2, 1998, and fully incorporated herein by reference, the inversion handler transfers the IC device 20 to a carrier 40 in a rotary table 44 of a rotary transport device 45 (also illustrated in FIG. 6), in a manner so that the IC device 20 is in the carrier 40 in a "dead bug" position, with connections 24 pointed up, away from the carrier 40.

Figure 2B:
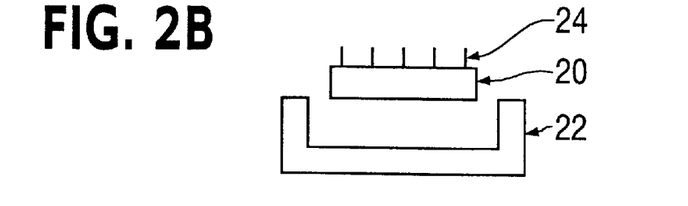
FIG. 2B depicts an IC device in a "dead bug" position.

The inversion handler is the preferred apparatus for placing the IC device 20 in the carrier 40 because it places the IC device 20 in the carrier 40 in the dead bug position, with connections 24 pointed up. The dead bug position, illustrated in FIG. 2B, is the preferred position for the IC device 20 while in the carrier 40 for the purposes of the present invention. The carrier 40 may hold one or more IC devices 20.

Figure 3A:
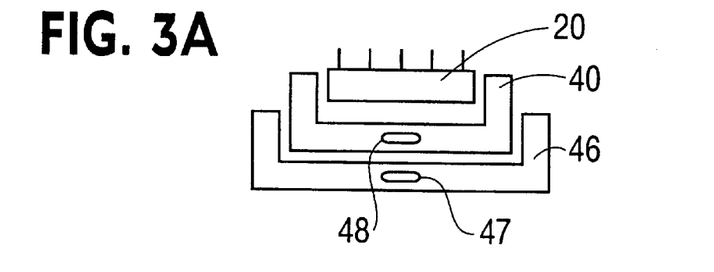
FIG. 3A depicts an IC device in a carrier, which in turn is in a receptacle in accordance with an embodiment of the present invention.
Figure 3B:
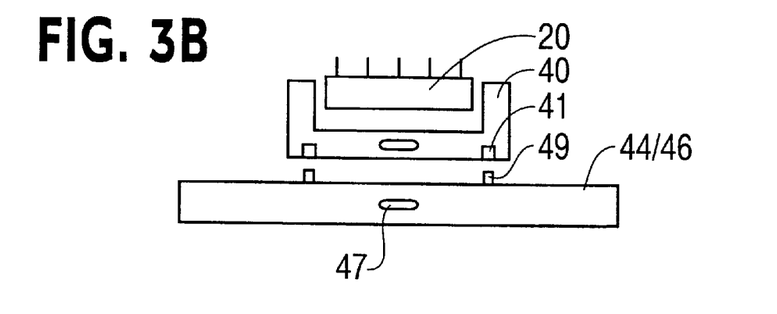
FIG. 3B depicts an IC device in a carrier, which in turn is in a receptacle in accordance with another embodiment of the present invention.

Referring to FIG. 3A, in an exploded view, the IC device 20 rests in the carrier 40, which in turn rests in a receptacle 46 of the rotary table 44 of the rotary transport device (not illustrated in this figure). The receptacle 46 has a first aperture 47 which lines up with a second aperture 48 in the carrier 40. More generally, the receptacle 46 refers to any device or part of a device which is used to acquire, guide, stabilize, align, contain, support, or hold the carrier 40 on the table 44. Another embodiment is shown in FIG. 3B, in which the table 44 comprises the receptacle 46, which includes the aperture 47 as well as a pair of locating pins 49. The locating pins 49 line up with and are inserted into locating holes 41 in the carrier 40.

Figure 1B:
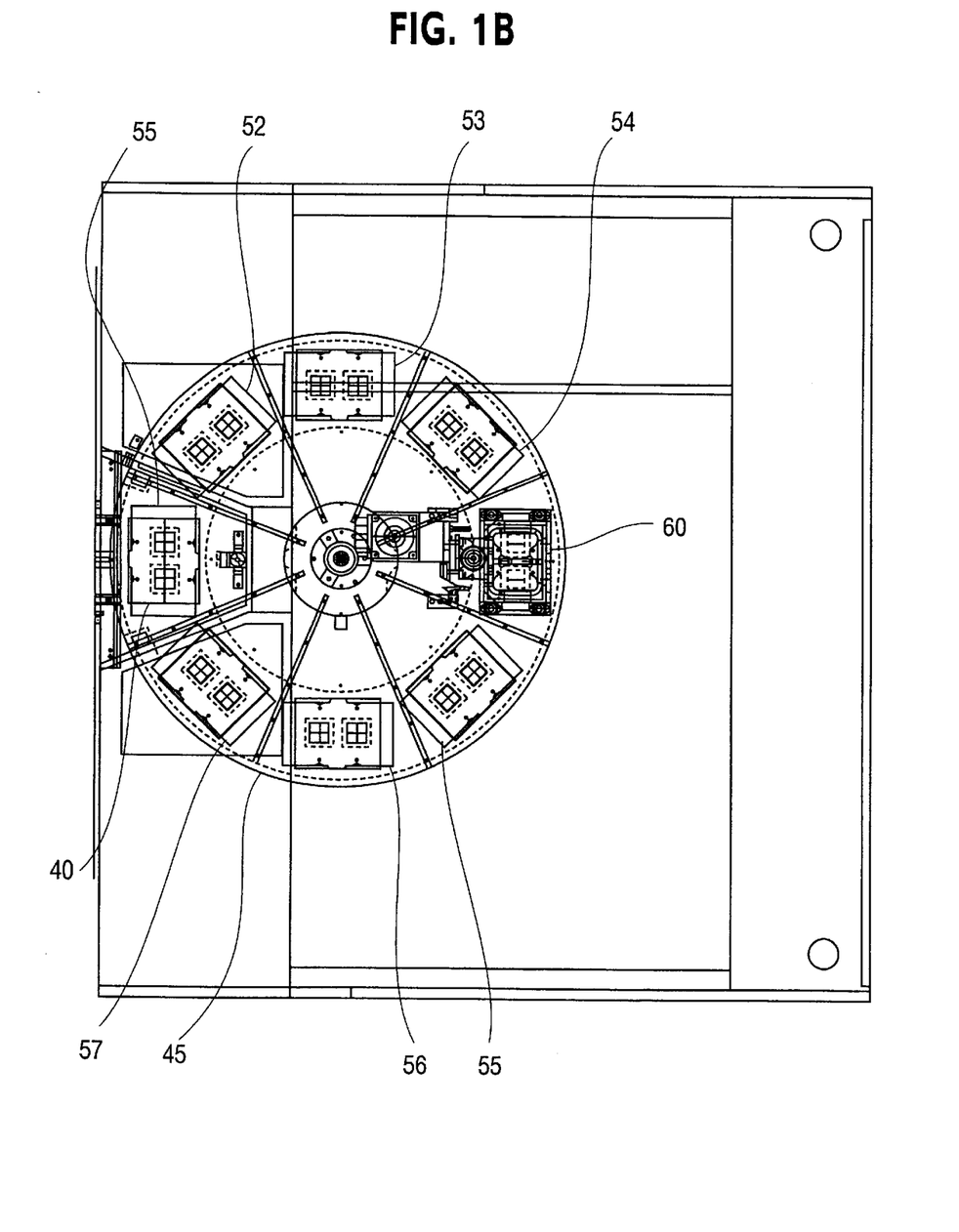
FIG. 1B is an exploded view of the rotary section of FIG. 1A.

Referring to FIGS. 1A, 1B, and 6A–6C, the carrier 40 preferably does not slide along a track nor is it moved along a conveyor belt. Instead, as illustrated in FIGS. 1A and 1B, the rotary table 44 of the rotary transport device 45 rotates around a shaft 247 (illustrated in FIG. 6C) to place the carrier 40 holding the IC device 20 in one or more positions or stations. The rotation of the rotary table 44 is preferably driven by a direct servo motor 246. Pneumatic brake 248 is used for normal load/unload. For example, in FIGS. 1A and 1B, the rotary transport device 45 has a staging station 50, six soak (or temperature control) stations 52, 53, 54, 55, 56, 57, and a test station 60, which, in the embodiment illustrated, is 180 degrees from the pick up, or staging, station 50. The rotary transport device 45 may have a plurality of carriers 40, such as one at every station, with each carrier holding one or more IC devices 20.

Referring again to FIGS. 1A and 1B, once the IC device 20 is placed in the carrier 40 at the staging station 50, the rotary transport device 45 rotates, placing the IC device and its carrier 40 in temperature control station 52. (While this rotation happens to be clockwise in the pictured embodiment, an alternative embodiment could rotate in some other manner, such as counterclockwise or may rotate in both clockwise and counterclockwise directions.)

2. The Temperature Control

Figure 4:
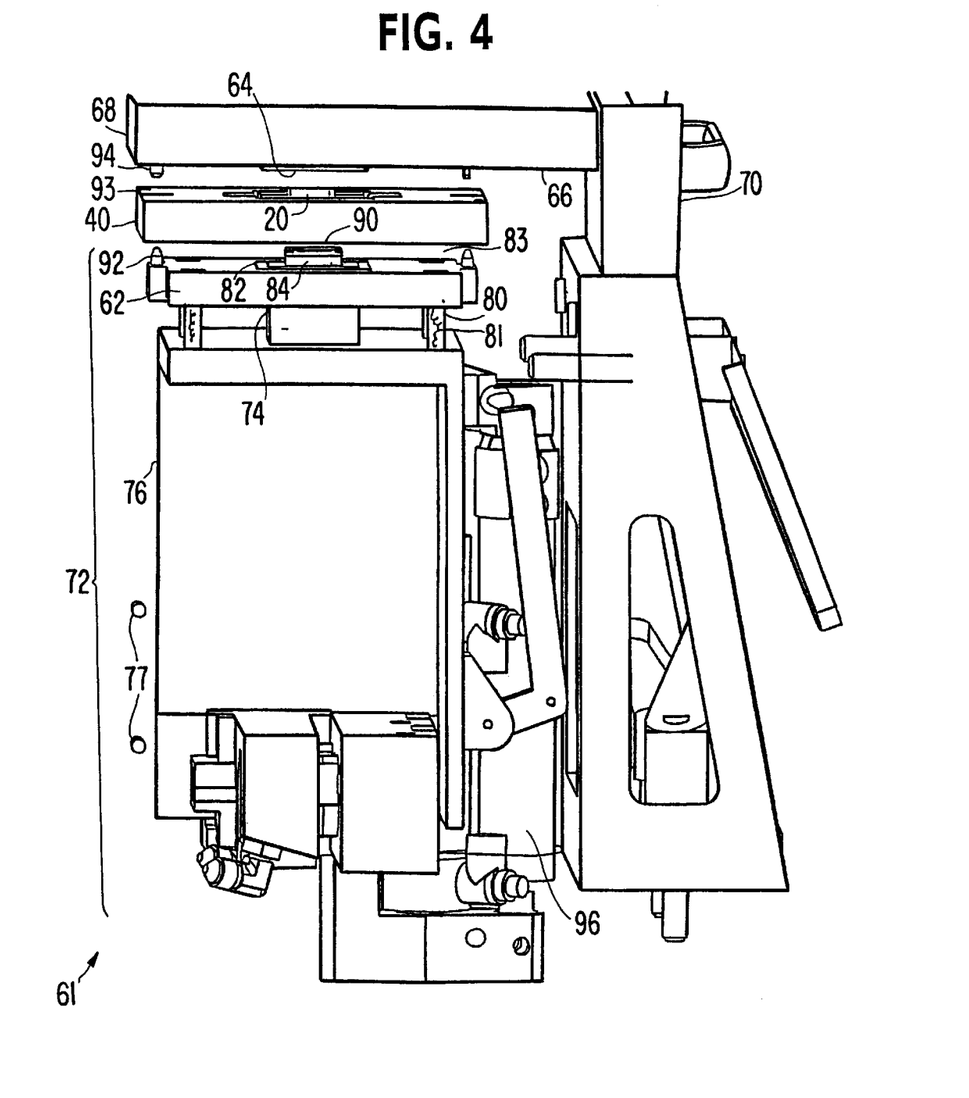
FIG. 4 depicts a soak station of an embodiment of the present invention.

Referring to FIG. 4, at temperature control station 52, the carrier 40 is positioned inside a soak station assembly 61. The carrier 40 is positioned above a lift pad 62 and below a spring-loaded pad 64 (springs not illustrated) on the underside roof 66 of an arm 68 of a framework 70 for the soak station assembly 61. If the IC device has connections (not illustrated in this figure), the spring-loaded pad 64 has small holes (not illustrated) for receiving those connections.

The lift pad 62 is part of a soak site actuator 72 of the soak station assembly 61. The soak site actuator 72 is preferably controlled by a fixed-stroke pneumatic cylinder 96 and includes the lift pad 62, soak tooling 74 (a tooling system), the soak station housing 76, pneumatic system (not illustrated), and end-of-travel sensors 77.

The lift pad 62 is supported on top of the soak station housing 76 by four shafts 80. The shafts 80 have a pre-loaded spring 81 on the outside of them, although many other variations on the number and placement of springs, or other impact absorbing devices is possible. The spring loading depends on the system and IC chip design but is generally less than 20 PSI. Bushings 83 are included for each of the shafts 80.

The soak tooling 74 as illustrated in FIG. 4 extends through an aperture 82 in the lift pad 62 and includes a heat exchanger housing 84, heating element 002 (see FIG. 9), a heat exchanger element 001 (see FIG. 9) (preferably a heat sink adapted to be cooled by a liquid), integrated temperature sensor 301 (see FIG. 9), a feedback loop (not fully illustrated), and a contact pad 90. In an alternative embodiment, the springs which are located in the spring-loaded pad 64 could be positioned under the soak tooling 74.

Figure 9:
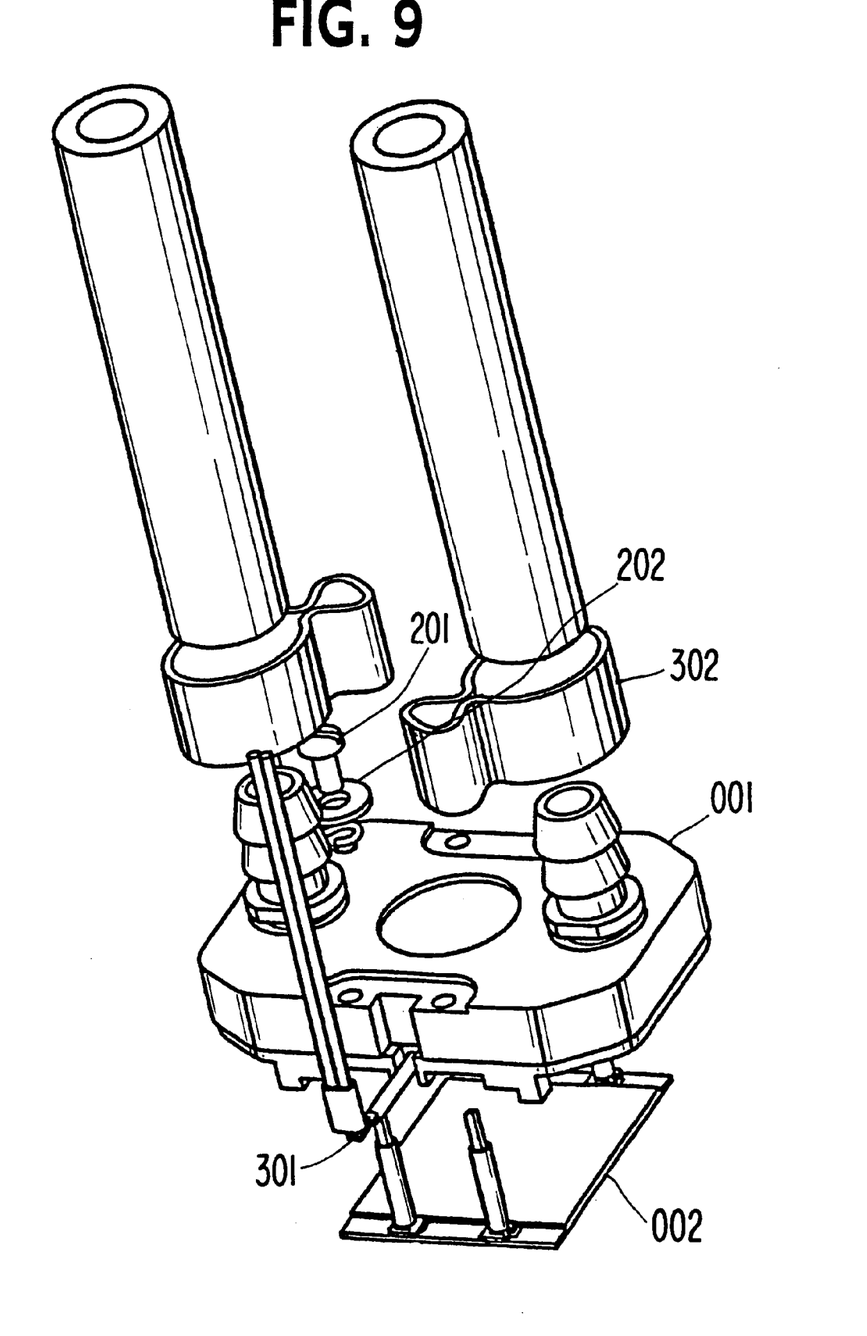
FIG. 9 is a heat exchanger assembly.

FIG. 9 illustrates a heat exchanger assembly. In the preferred embodiment, the heat exchanger assembly is inside of heat exchanger housing 84. As described above, the heat exchanger assembly of FIG. 9 includes heat exchanger element 001, heating element 002, and integrated temperature sensor 301. The heat exchanger assembly of FIG. 9 also includes a variety of other components including screw 201, washer 202, and bracket 302.

There are two upwardly-pointing precising pins 92 on the lift pad 62 as well as two downwardly-pointing precising pins 94 on the underside roof 66 of the arm 68 of the framework 70.

Once the carrier 40 is in place, the soak site actuator 72 activates and lifts the lift pad 62 until it is touching the bottom of the carrier 40. The carrier 40 has holes (not illustrated) in its underside which engage the upwardly-pointing precising pins 92.

As the soak station actuator 72 continues to lift the carrier 40, holes 93 in the top of the carrier engage the downwardly-pointing pins 94 until the carrier is placed against the underside roof 66. The end of travel sensors 77 limit the movement of the soak station actuator 72.

The arm 68 contacts the stationary carrier 40 and compresses springs 81, allowing the soak tooling 74 to continue to travel through aperture 47 (not illustrated here, see FIG. 3A) in receptacle 46 (not illustrated here, see FIG. 3A) and through the second aperture 48 (not illustrated here, see FIG. 3A) in the carrier 40 until the contact pad 90 contacts the bottom of the IC device 20. The soak tooling 74 continues to lift the IC device 20 above the carrier 40 until the IC device 20 is in contact with the spring-loaded pad 64 on the underside roof 66 of the arm 68 of the framework 70.

Upon initial contact of the IC device 20 and the spring-loaded pad 64, a spring (not illustrated, but analogous to spring 137 in FIG. 5D) within the heat exchanger assembly (see FIG. 9) compresses. This compression allows the contact pad 90 to continue to rise and to make contact with the bottom of the IC device 20. The compression continues until the heat exchanger assembly (see FIG. 9) is below the surface of the contact pad 90 (contact pad 90 is at the top of soak tooling 74). Then, different springs (not illustrated, but analogous to springs 139 in FIG. 5B) above spring-loaded pad 64, and below the arm 68, compress and exert the required force against the IC device 20 needed to hold the device 20 in place during the soak/de-soak.

This method allows separate forces to be applied for contacting the heat exchanger assembly to the IC device 20 and for holding the IC device 20 against the spring-loaded pad 64. Other embodiments may utilize different mechanisms to apply the different forces, including without limitation, flat springs, rubber or some other compressible material, and shock absorbers.

The soak tooling 74 is designed for the particular IC device to be tested, so that the soak tooling 74 travels the proper distance ("the stroke") for that particular IC device and then it activates the end of travel sensors 77. The end of travel sensors 77 are activated by a flag which is coupled to the soak tooling housing 76.

After the IC device 20 is engaged against the spring-loaded pad 64 and the heat exchanger assembly is in contact with the IC device 20, the heating or cooling cycle may begin. The integrated temperature sensor (not illustrated) measures the temperature of the heat exchanger element (not illustrated) and uses the measured temperature of the heat exchanger element to change the temperature of the heating element (not illustrated), the temperature sensor determines how much the temperature of the heat exchanger element is lowered/raised by the transfer of heat to/from the IC device 20. The feedback loop (not illustrated) sends this information to a thermal control circuit 160 (see FIG. 8), which adjusts the energy to the heating element to optimize the temperature of the IC device 20.

Figure 8:
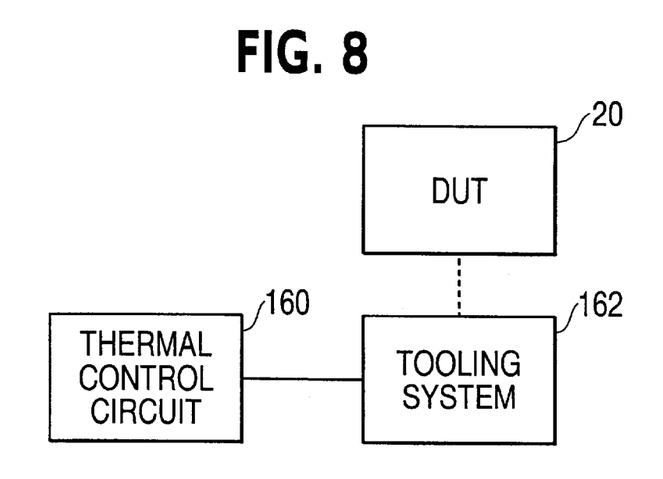
FIG. 8 illustrates a thermal control circuit connected to a tooling system.

Referring to FIG. 8, there is shown a thermal control circuit 160 connected to a tooling system 162. The tooling system 162 may be a soak tooling 74 (see FIG. 4) or a test tooling 130 (see FIGS. 5A and 5D), for example. The tooling system 162 is shown with a dashed line to a DUT 20, indicating that the tooling system 162 is adapted to be coupled to the DUT 20.

After the desired temperature is reached, the pneumatically-controlled soak station actuator 72 retracts. Then the springs 81 relax, allowing the IC device 20 to return to the carrier 40. The rotary transport device 45 rotates to the next position.

In the preferred embodiment of the invention pictured in FIG. 1A, there are three temperature control stations 52–54 for the IC device 20 to rotate through before reaching the test station 60. Each temperature control station 52–54 raises the temperature of the IC device 20 by a pre-defined value. The temperature of the air inside of the temperature control stations 52–54 is preferably maintained close to ambient.

In the embodiment of the invention pictured in FIGS. 1A and 1B, there is also a fourth temperature control station 55 which the IC device 20 rotates through after completing the test at the test station 60. At this fourth temperature control station 55, the temperature of the IC device 20 is brought below a safe "touch" temperature or above the dew point temperature, as explained earlier. In alternate embodiments there could be more than one post-test temperature control station 55. There are two additional stations 56–57 which are not used at this time, but which could be used to further heat or cool the device 20.

The total number of temperature control stations used in alternative embodiments may vary, depending upon test times, number of devices in parallel, and the time required to soak the particular IC device that the embodiment is targeting.

When the soak tooling 74 lifts the IC device 20 above the carrier 40, the thermal isolation between the IC device 20 and the carrier 40 is increased. This enables the soak tooling 74 to more effectively control the temperature of the IC device and also minimizes the thermal stress to the carrier 40 and other parts.

The Test Station

Figure 7A:
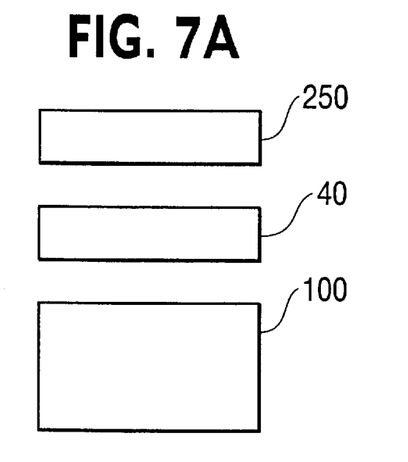
FIG. 7A shows the general orientation of the test head, the carrier, and the test actuator assembly prior to testing of a DUT, according to an embodiment of the present invention.

After rotating the IC device 20 through the temperature adjustment stations 52–54, the rotary transport device 45 rotates again, placing the IC device 20 into the test station 60. At the test station 60, the carrier 40 is positioned above a test actuator assembly 100 (illustrated in FIGS. 5A–5E) and below a test head 250, as illustrated in FIG. 7A.

Figure 5A:
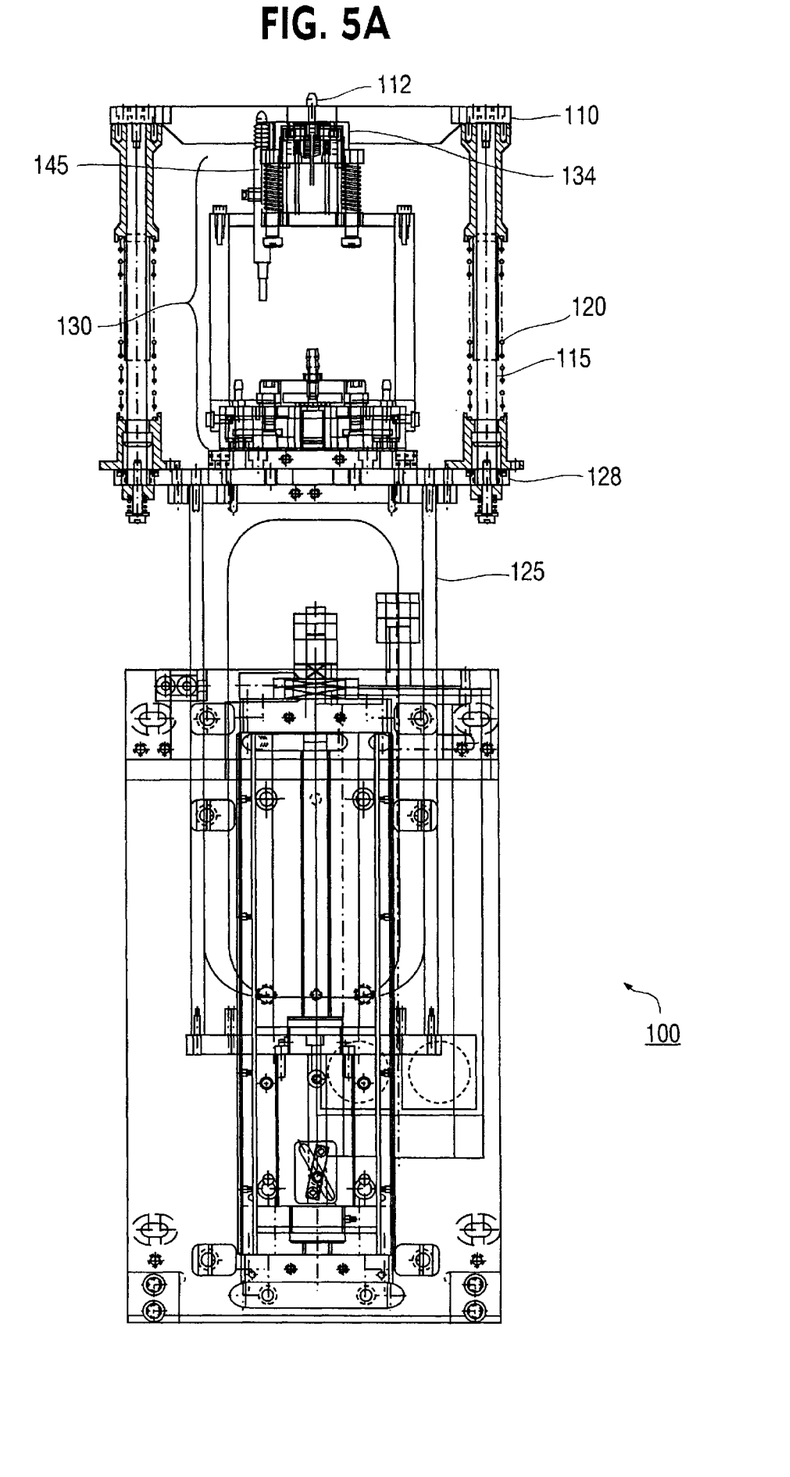
FIG. 5A depicts a cross view of a test actuator assembly in accordance with an embodiment of the present invention.
Figure 5B:
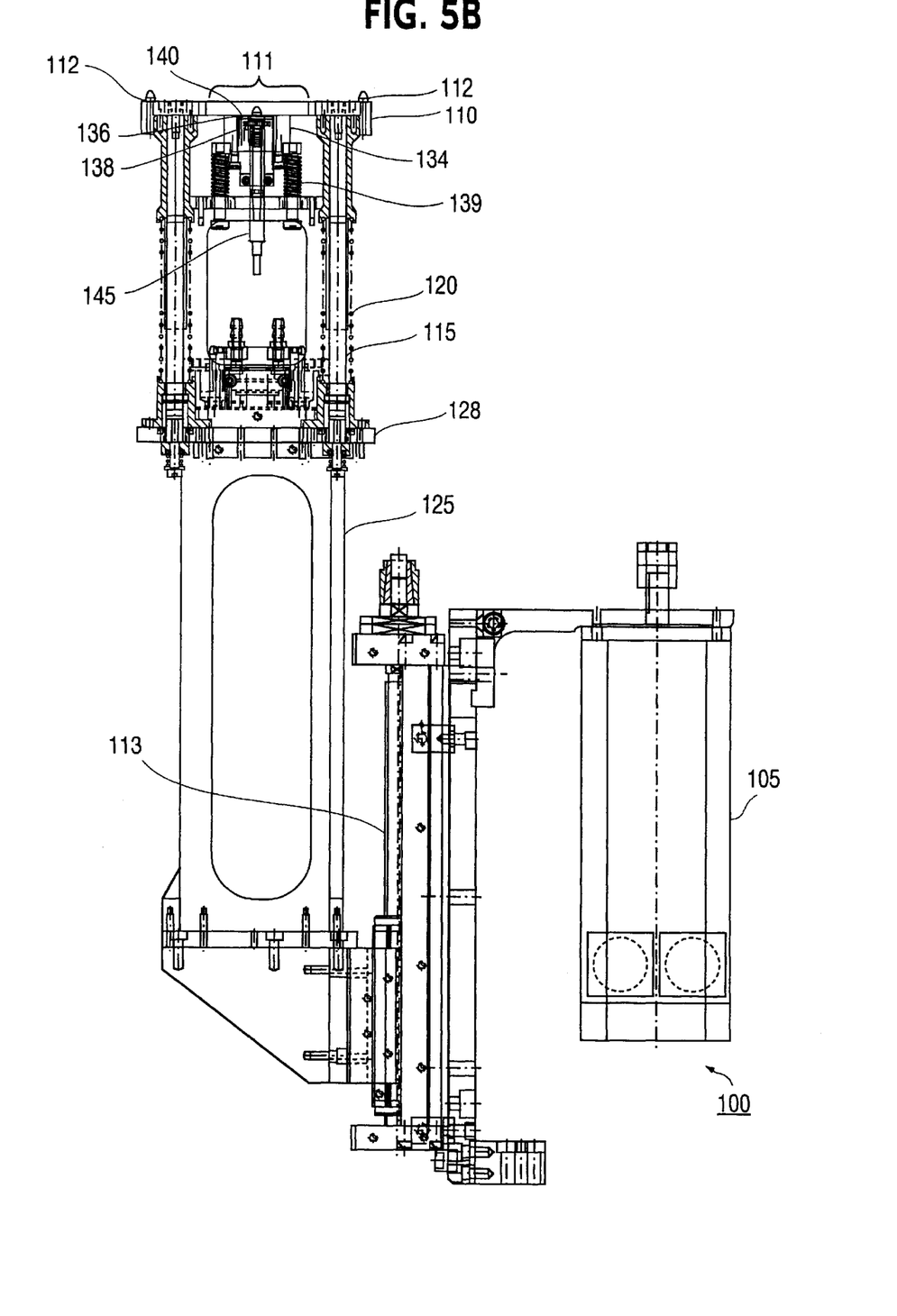
FIG. 5B depicts a side-view of a test actuator assembly in accordance with an embodiment of the present invention.
Figure 5C:
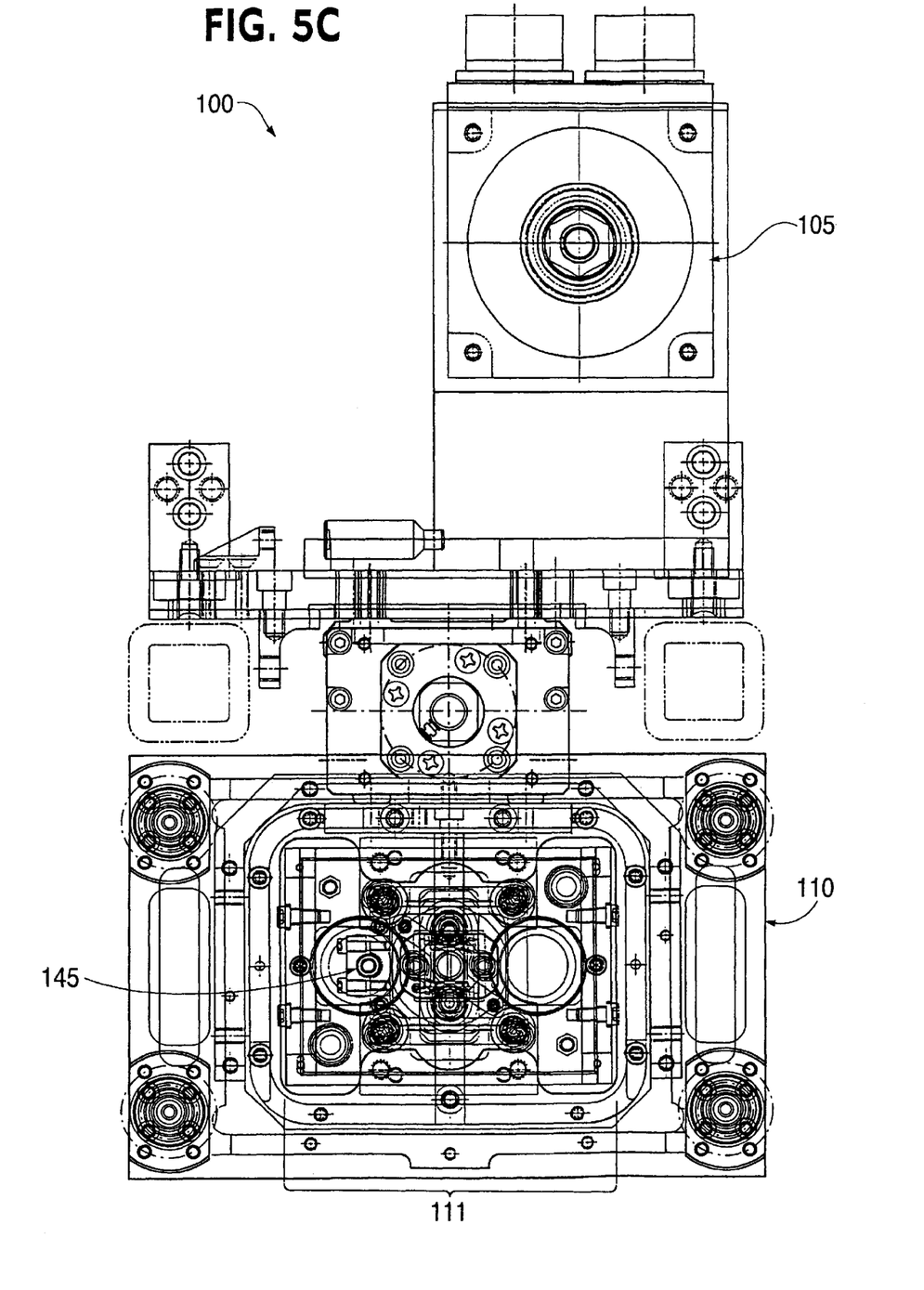
FIG. 5C depicts a top view of a test actuator assembly in accordance with an embodiment of the present invention.
Figure 5D:
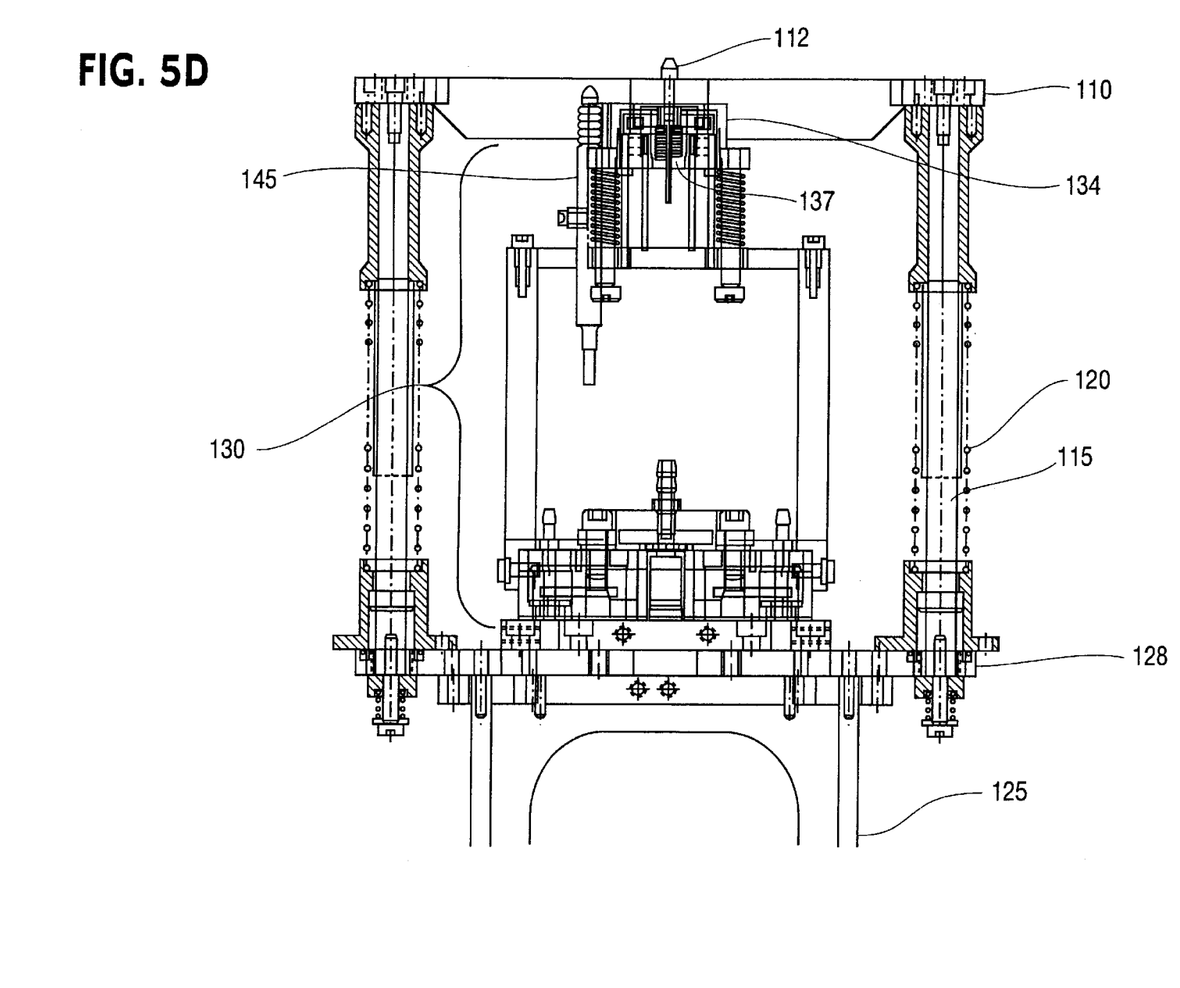
FIG. 5D is an exploded view of a portion of FIG. 5A.
Figure 5E:
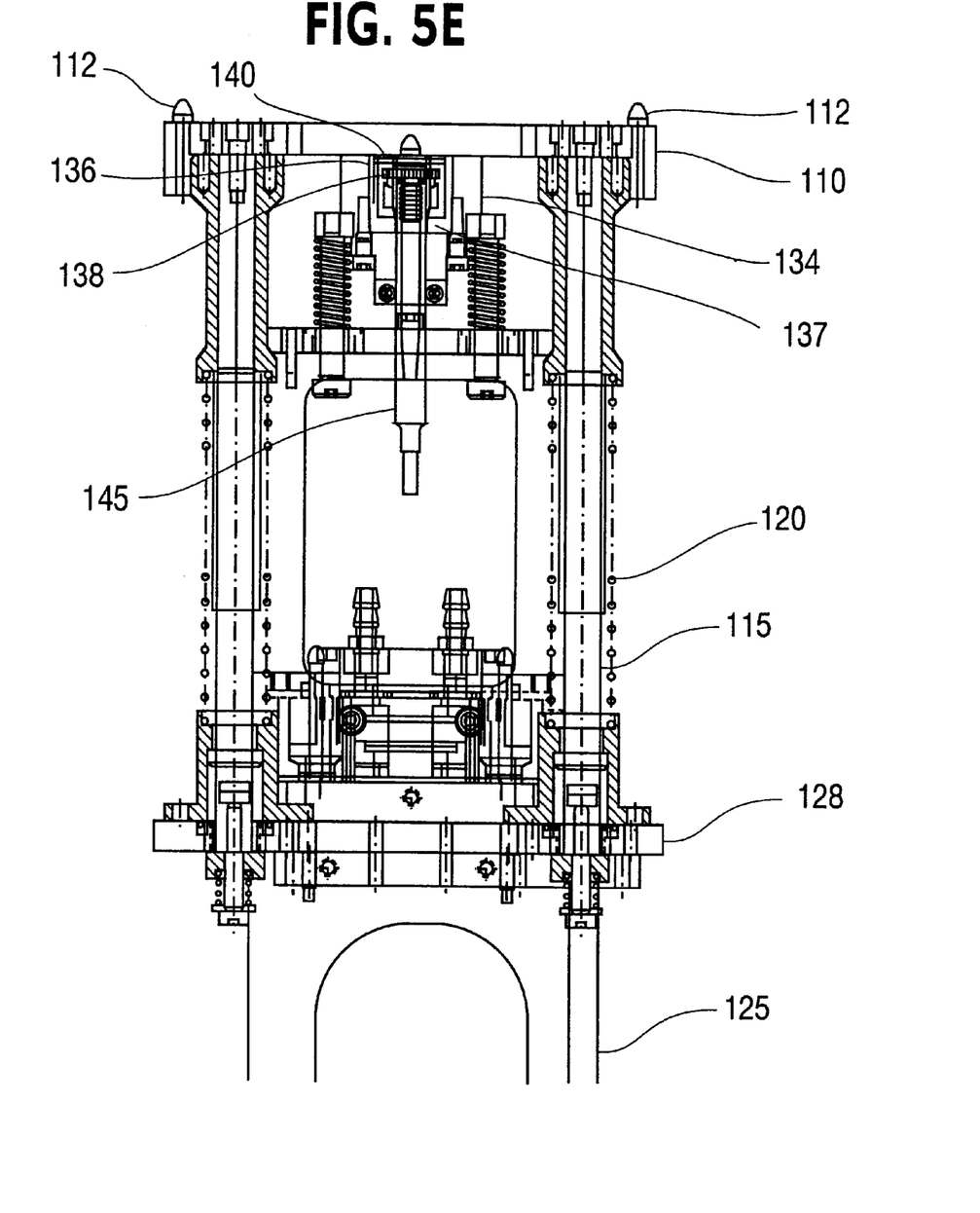
FIG. 5E is an exploded view of a portion of FIG. 5B.
Figure 6A:
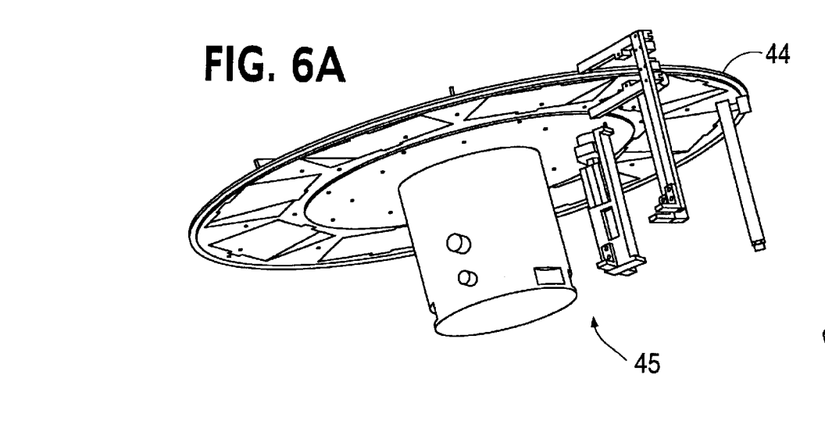
FIG. 6A depicts a perspective bottom view of a rotary transport device in accordance with an embodiment of the present invention.
Figure 6B:
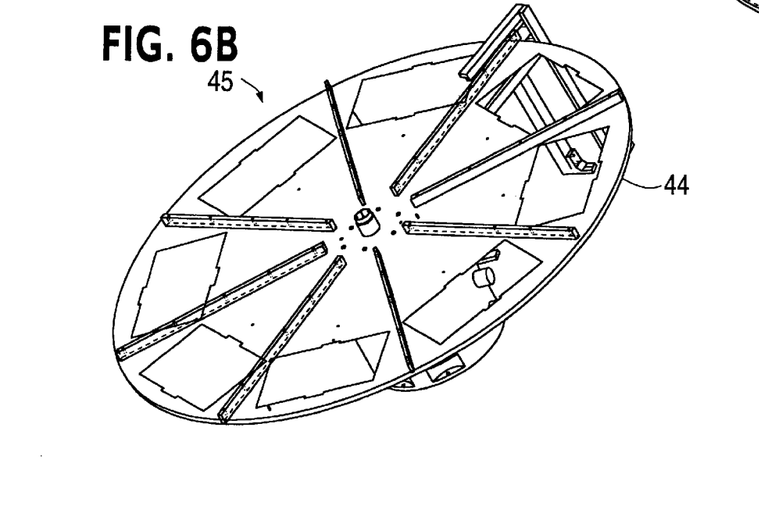
FIG. 6B depicts a perspective top view of a rotary transport device in accordance with an embodiment of the present invention.
Figure 6C:
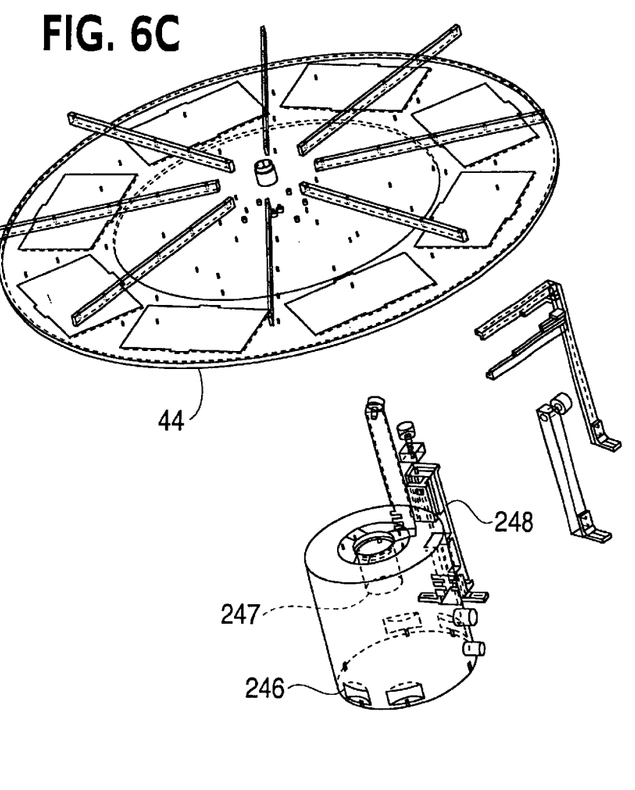
FIG. 6C depicts an exploded perspective top view of a rotary transport device in accordance with an embodiment of the present invention.

The test actuator assembly 100 is driven by a servo motor 105 (see FIGS. 5B and 5C) and includes a test liftplate 110, with an aperture 111, and resting on four hafts 115 with springs 120 outside. Referring to FIGS. 5A and 5D, the shafts 115 are attached to the framework 125 of the test actuator assembly 100 at a base plate 128 and extend through the bottom. Inside the four shafts 115, below an aperture (not illustrated in FIGS. 5A or 5D) in the test lift plate 110 and above the base plate 128, is a test tooling 130 (a tooling system). As illustrated in FIGS. 5B and 5E, the test tooling 130 includes a heat exchanger housing 134, a heating element 136 (see also 002 in FIG. 9), a heat exchanger element (preferably a liquid cooled heat sink) 138 (see also 001 in FIG. 9) an integrated temperature sensor (301 in FIG. 9), a feedback loop (not fully illustrated), a test precising pin 112, and a contact pad 140.

The heat exchanger assembly of FIG. 9 was described earlier in the section on temperature control. A heat exchanger assembly, as in FIG. 9, is also inside of heat exchanger housing 134. Thus, the heat exchanger assembly of FIG. 9 is preferably inside of each of the six soak stations 52–54, 55–57, and the test station 60.

In operation, the servo motor 105 drives a pulley (not illustrated), which turns a ballscrew 113, which causes the base plate 128 to move upwards, until the test lift plate 110 is placed against the carrier 40. Once contact with the carrier 40 is made, the base plate 128 continues to move upwards, until the test lift plate 110 is pressed against the carrier 40 which in turn is pressed against a socket 255 in the test head 250 (see FIGS. 7A and 7B).

Then the base plate 128 continues to move upward, allowing the test tooling 130 to pass through the aperture 111 in the test lift plate 110. This continued movement of the base plate 128 compresses the springs 120 inside the shafts 115, as the shafts 115 extend out the bottom of the base plate 128. The test tooling 130 passes through the second aperture 48 in carrier 40 to be pressed against the IC device 20. Note that the IC device 20 is in a dead bug position with the connections pointing upward to the test head 250 (see FIGS. 7A and 7B).

Figure 7B:
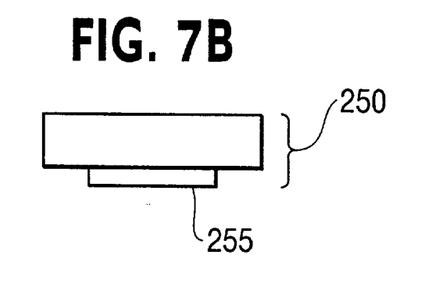
FIG. 7B shows the test head comprising the socket, according to an embodiment of the present invention.

The base plate 128 continues to extend, lifting the IC device 20, until the connectors of the IC device 20 are in contact with socket 255 in the test head 250 (see FIGS. 7A and 7B). Upon initial contact of the IC device 20 and the socket 255 connections, spring 137 (see FIG. 5D) compresses. This compression allows the contact pad 140 to continue to rise and to make contact with the bottom of the IC device 20. The compression continues until the heat exchanger assembly (see FIG. 9) is below the surface of the contact pad 140 (see FIG. 5B).

Then, springs 139 (see FIG. 5B) compress and exert the required force against the IC device 20, through the contact pad 140, needed to fully mate the IC device 20 with the socket 255. This method allows separate forces to be applied for contacting the heat exchanger assembly to the IC device 20 and for socketing the IC device 20.

When the test tooling 130 lifts the IC device 20 above the carrier 40, the thermal isolation between the IC device 20 and the carrier 40 is increased. This enables the test tooling 130 to more effectively control the temperature of the IC device 20 and also minimizes the thermal stress to the carrier 40 and other parts.

To limit the movement of the IC device 20 or for calibration, a linear variable displacement transducer 145 may be used. A part such as an IC device of a known thickness is cycled through the system to the test station 60. The part would be set up to socket with the test head while measurements of the linear variable displacement transducer 145 are being read upon an output. The linear variable transducer 145 will move some distance in the vertical or Z direction, that is, moving the part towards being socketed with the test head. The linear variable displacement transducer 145 tells when the part has "bottomed out" in the test head socket. Software controlling the apparatus of the invention has a database with part-specific thickness values and the desired gap between the package bottom and the test head base. These values will be used to program the Z axis position of the part. If the mechanism shifts for some reason (e.g., thermal expansion, variable spring Constants) the Z axis distance can be adjusted to maintain the desired gap.

Thus, through the use of the linear variable displacement transducer 145 (a distance measurer), the IC device 20 can be brought to desired gap (for example, 1/1000 inch), bottomed-out, or past the point of bottoming out by further compressing the spring inside of the linear variable displacement transducer 145. This allows the measurement of the distance traveled by the IC device 20 in relation to the socket 255, for example and without limitation, to be measured directly. Other embodiments can utilize different techniques and/or devices, known in the art, to measure this distance, or can apply a calibrated amount of force to achieve a desired distance.

The linear variable displacement transducer 145 can be used to determine the extent of the movement of the IC device 20, particularly if the IC device 20 is not desired to be "bottomed-out" against the test socket, fully compressing the socket contacts. The linear variable displacement transducer 145 can also be used for error recovery, providing precise feedback on the extent of the IC device travel.

Pressure from the heat exchanger housing 134 which is spring loaded and coupled to base plate 128 sockets the IC device 20 in the test head and allows for testing. The temperature of the device 20 is controlled during the test, using any feedback mode such as the one described above for the soak station or the power following feedback mode described in co-pending provisional patent application U.S. Ser. No. 60/092,720 (attorney docket number 42811-104), filed on Jul. 14, 1998 and hereby incorporated by reference.

After testing, the servo motor 105 allows the base plate 128 to retract. The IC device 20 de-couples from the test head and returns to the carrier 40. Then base plate 128 continues to retract until it reaches its original position, allowing the carrier 40 to do the same. The rotary transport device 45 then rotates the IC device 20 through the remaining temperature control stations 55–57, if necessary, to adjust the temperature once more to a safe handling temperature or above the dew point temperature.

At the staging station 50, as described in co-pending application U.S. Ser. No. 60/110,827, the IC device 20 is gripped by the inversion handler and inverted to a live bug position. The vacuum handler retrieves the IC device 20 from the inversion handler and returns it to its JEDEC tray 22.

In the preferred embodiment of the invention, the IC device 20 is sorted into trays identified by bin codes. The bin code may be either a pass bin code or a fail bin code.

In an alternative embodiment, a "soft sort" process can be used, whereby a tray map can be maintained for each tray. The tray map is a database which maps the location of each IC device 20 in the tray and the results of the IC device's test.

The device handler described in this disclosure thus includes a variety of advantages. By lifting an IC device 20 off of the carrier 40, the IC device 20 is no longer in direct contact with the carrier 40. This lowers the effective thermal mass which must be heated or cooled in order to heat or cool the IC device 20. A given temperature can, therefore, be achieved in a shorter amount of time.

Further, the system is able to respond to self-heating of the IC device 20. If the system had to heat or cool the larger thermal capacitance of the carrier 40, it would take longer to respond to self-heating of the IC device 20. Such delay would make it more difficult, and in some cases prohibitively so, to maintain the temperature of the IC device 20 within specified limits.

The carrier 40 is also spared the additional thermal stress of being heated or cooled, sometimes with large, quick temperature deviations. This improves the system's reliability and reduces both the initial cost to design and manufacture, due to simpler material constraints, as well as the maintenance costs.

The system also lifts the IC device 20 off of the carrier 40 in both soak stations and the test station, with the same motion. This reduces the complexity of the system and the number of parts required compared to systems which utilize different motions in soak stations versus test stations.

The system is also able to use lower forces when lifting the IC device 20 because the carrier 40 does not need to be lifted. The carrier 40 is usually considerably heavier than the IC device 20. This allows the system to use smaller, less expensive motors and servos which are also typically easier to maintain. This also reduces the risk of damage and stress to the carrier 40. Perhaps more importantly, the risk of damage to the IC device 20 and the socket is also lowered.

The system also incorporates springs which absorb some of the force and impact. Coil springs are simply one form of impact absorbers. Other impact absorbers include flat springs, compressible materials, and fixtures which are not locked in place. Springs are used in the disclosed embodiment, for example, in the springs 81, the spring-loaded pad 64, and the springs 120. This use of springs further reduces the risk of damage to the IC device 20 and the socket. The springs are used in both the soak stations and the test station.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit of the invention.

We claim:

1. A system for handling a device under test ("DUT"), comprising:

a carrier to support the DUT, the carrier defining an aperture which is adapted to be disposed below at least a portion of the DUT;

a receptacle to support the carrier, the receptacle defining an aperture, and the receptacle being adapted to maintain the alignment of the carrier such that the carrier aperture overlaps at least part of the receptacle aperture;

a tooling system to conductively control a temperature of the DUT and to support the DUT; and a lift mechanism coupled to the tooling system to raise and lower the tooling system when both the receptacle aperture and the carrier aperture are vertically aligned with the tooling system such that at least a portion of the tooling system can penetrate both the receptacle aperture and the carrier aperture and contact the DUT, wherein the lift mechanism is further coupled to the receptacle to facilitate the vertical alignment;

wherein, when the tooling system is raised to contact the DUT, the lift mechanism further raises the tooling system to raise the DUT above the carrier such that the DUT is not in direct contact with the carrier.

2. The system for handling a device under test ("DUT") as recited in claim 1, further comprising a test head disposed above the receptacle and coupled to the lift mechanism, wherein the test head is adapted to contact the DUT when the DUT is lifted above the receptacle, and wherein the lift mechanism comprises a servo motor and a ballscrew.

3. The system for handling a device under test ("DUT") as recited in claim 1, further comprising a spring-loaded pad disposed above the receptacle and coupled to the lift mechanism, wherein the spring-loaded pad is adapted to contact the DUT when the DUT is lifted above the receptacle, and wherein the lift mechanism comprises a device selected from the group consisting of a soak site actuator and a fixed-stroke pneumatic cylinder.

4. The system for handling a device under test ("DUT") as recited in claim 1, further comprising:

a second tooling system to conductively control a temperature of the DUT and to support the DUT;

a second lift mechanism coupled to the second tooling system to raise and lower the tooling system when both the receptacle aperture and the carrier aperture are vertically aligned with the second tooling system such that at least a portion of the second tooling system can penetrate both the receptacle aperture and the carrier aperture and contact the DUT, wherein the second lift mechanism is further coupled to the receptacle to facilitate the vertical alignment; and a transport device coupled to the receptacle, to move the receptacle from a position disposed over at least part of one of the two tooling systems to a position disposed over at least part of the other of the two tooling systems;

wherein, when the second tooling system is raised to contact the DUT, the second lift mechanism further raises the second tooling system to raise the DUT above the carrier such that the DUT is not in direct contact with the carrier.

5. The system for handling a device under test ("DUT") as recited in claim 4, further comprising:
   a test head coupled to the lift mechanism and adapted to be disposed above the receptacle, wherein the test head is adapted to contact the DUT when the DUT is lifted above the receptacle; and
   a spring-loaded pad coupled to the second lift mechanism and adapted to be disposed above the receptacle, wherein the spring-loaded pad is adapted to contact the DUT when the DUT is lifted above the receptacle;
   wherein:
      the lift mechanism comprises a servo motor and a ballscrew, the second lift mechanism comprises a fixed-stroke pneumatic cylinder, the tooling system comprises a test tooling, and the second tooling system comprises a soak tooling.

6. The system for handling a device under test ("DUT") as recited in claim 5, further comprising:
   a second carrier to support the DUT, the second carrier defining an aperture which is adapted to be disposed below at least a portion of the DUT; and
   a second receptacle coupled to the transport device to support the second carrier, the second receptacle defining an aperture, and the second receptacle being adapted to maintain the alignment of the second carrier such that the second carrier aperture overlaps at least part of the second receptacle aperture;
   wherein both the receptacle and the second receptacle are separately moved from a position disposed over one of the two tooling systems to a position disposed over the other of the two tooling systems.

7. The system for handling a device under test ("DUT") as recited in claim 6, wherein the transport device comprises a rotary transport device.

8. The system for handling a device under test ("DUT") as recited in claim 7, further comprising a rotary table coupled to the rotary transport device, wherein the rotary table comprises the receptacle and the second receptacle.

9. The system for handling a device under test ("DUT") as recited in claim 8, wherein:
   the rotary table further comprises six additional receptacles, and the eight receptacles are disposed in a plane at a common radius from a point on the rotary table and are separated from each other by a common separation angle; and
   the system further comprises six additional carriers, each of the eight carriers is supported by one of the eight receptacles, and each of the eight carriers is adapted to support a separate DUT in a position in which the contact leads of the separate DUTs are facing up.

10. The system for handling a device under test ("DUT") as recited in claim 1, wherein the tooling system comprises:
    a heat exchanger housing;
    a heat exchanger element;
    a heating element; and
    a contact pad.

11. The system for handling a device under test ("DUT") as recited in claim 10, wherein the tooling system further comprises a feedback loop and an integrated temperature sensor.

12. The system for handling a device under test ("DUT") as recited in claim 1, wherein the tooling system can conductively control a temperature of the DUT to heat the DUT and to cool the DUT.

13. The system for handling a device under test ("DUT") as recited in claim 1, further comprising a thermal control circuit to control the tooling system.

14. The system for handling a device under test ("DUT") as recited in claim 13, wherein the thermal control circuit controls the tooling system using a power following closed-loop method.

15. A method of handling a device under test ("DUT"), the method comprising:
    supporting the DUT with a carrier which defines a first aperture and a receptacle which defines a second aperture and supports the carrier;
    contacting the DUT with a conductive temperature control system through the first and second apertures;
    vertically raising the supported DUT off of the carrier so that the DUT is not in direct contact with the carrier; and
    maintaining contact between the DUT and the conductive temperature control system while the DUT is not in direct contact with the carrier.

16. The method of handling a device under test ("DUT") as recited in claim 15, further comprising controlling the temperature of the DUT to maintain the DUT at approximately a specified set point temperature despite self-heating of the DUT.

17. The system for handling a device under test ("DUT") as recited in claim 1, wherein the tooling system comprises a heat exchanger and a contact pad, the tooling system is adapted to apply a first force for contacting the heat exchanger to the DUT, the tooling system is adapted to apply a second force for contacting the contact pad to the DUT to secure the DUT in a fixed location for testing, and the first force is different from the second force.

18. The system for handling a device under test ("DUT") as recited in claim 17, wherein securing the DUT comprises at least one of socketing the DUT to a socket and holding the DUT against the contact pad.

19. The system for handling a device under test ("DUT") as recited in claim 17, wherein applying the first force comprises utilizing a first spring, applying the second force comprises utilizing a second spring, and the first spring is different from the second spring.

20. The system for handling a device under test ("DUT") as recited in claim 17, wherein applying the first force comprises utilizing at least one of a coil spring, a flat spring, rubber material, and a shock absorber.

21. The system for handling a device under test ("DUT") as recited in claim 1, further comprising a distance measurer, wherein the distance measurer is for measuring distance traveled by the DUT, and wherein the system is adapted to use distance traveled by the DUT to control position of the DUT.

22. The system for handling a device under test ("DUT") as recited in claim 21, wherein the distance measurer comprises a linear variable displacement transducer which measures distance traveled by the DUT in relation to a socket.

23. The method of handling a device under test ("DUT") as recited in claim 15, further comprising:
    measuring a distance traveled by the DUT;
    providing feedback on the distance traveled; and
    utilizing the distance traveled to control the position of the DUT.

* * * * *